(12) United States Patent
Lee

(10) Patent No.: US 7,177,214 B2
(45) Date of Patent: Feb. 13, 2007

(54) METHODS AND SYSTEMS FOR DYNAMICALLY SELECTING WORD LINE OFF TIMES AND/OR BIT LINE EQUALIZATION START TIMES IN MEMORY DEVICES

(75) Inventor: Jung-Bae Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 10/991,729

(22) Filed: Nov. 18, 2004

(65) Prior Publication Data

US 2005/0122810 A1   Jun. 9, 2005

(30) Foreign Application Priority Data

Dec. 4, 2003   (KR) .................. 10-2003-0087535

(51) Int. Cl.
*G11C 7/00* (2006.01)

(52) U.S. Cl. .................. 365/203; 365/233; 365/189.07

(58) Field of Classification Search ................ 365/203, 365/233, 189.07, 63, 185.25, 194, 133.5, 365/205, 207, 189.05, 49, 230.08
See application file for complete search history.

(56) References Cited

U.S. PATENT DOCUMENTS

| | | | |
|---|---|---|---|
| 6,788,597 B2 * | 9/2004 | Ladner et al. ............... | 365/200 |
| 6,865,101 B2 * | 3/2005 | Iwanari ....................... | 365/145 |
| 6,967,886 B2 * | 11/2005 | Huang et al. ................ | 365/222 |
| 2003/0191974 A1 * | 10/2003 | Kato et al. ................... | 713/300 |

FOREIGN PATENT DOCUMENTS

| | | |
|---|---|---|
| JP | 2001-266570 | 10/2001 |
| KR | 000020619 | 4/2000 |
| KR | 1020020057284 | 7/2002 |
| KR | 2003-0080991 | 10/2003 |

OTHER PUBLICATIONS

Notice to Submit Response, Korean Application No. 10-2003-0087535, Aug. 31, 2005.

* cited by examiner

*Primary Examiner*—Richard Elms
*Assistant Examiner*—Dang Nguyen
(74) *Attorney, Agent, or Firm*—Myers Bigel Sibley & Sajovec

(57) ABSTRACT

Methods for controlling the timing of a pre-charge operation in a memory device are provided. In embodiments of the present invention, the timing may be controlled by dynamically selecting a word line off time based on information about a number of column cycles. This may be accomplished, for example, by routing a word line disable signal via one of a first plurality of delay paths. The methods may further include dynamically selecting a bit line equalization start time based on the information about the number of column cycles. This may be accomplished, for example, by routing a bit line equalization start signal via one of a second plurality of delay paths. Pursuant to still further embodiments of the present invention, systems for controlling timing in a memory device are provided which include a control circuit that is configured to select a word line off time from a plurality of word line off times in response to a word line signal and information about a number of column cycles.

29 Claims, 7 Drawing Sheets

METHODS AND SYSTEMS FOR DYNAMICALLY SELECTING WORD LINE OFF TIMES AND/OR BIT LINE EQUALIZATION START TIMES IN MEMORY DEVICES

CROSS-REFERENCE TO RELATED APPLICATION

This application claims priority under 35 U.S.C. § 119 to Korean Patent Application No. 2003-87535, filed on Dec. 4, 2003, the disclosure of which is incorporated herein by reference as if set forth in its entirety.

FIELD OF THE INVENTION

The present invention relates to semiconductor memory devices, and more particularly, to methods and systems for controlling timing in semiconductor memory devices.

BACKGROUND OF THE INVENTION

During a read operation that reads data from a cell of a memory device ("a cell data read operation"), a word line corresponding to the cell is activated to turn on a transistor in the cell. The data stored in the cell is delivered via the turned-on cell transistor to a bit line. Since the capacitance of the bit line is greater than the capacitance of the cell, the voltage variation on the bit line may be small. This small voltage variation is sensed and amplified by a bit line sense amplifier, and then delivered to a local data line. The data path of a write operation may be the opposite of the above-described data path for the read operation.

FIGS. 1A and 1B are timing diagrams that illustrates certain timing parameters associated with a conventional memory cell data read operation. In FIG. 1A, the read operation involves a single column cycle (i.e., a column cycle of 1).

Referring to FIG. 1A, the cell data read operation starts when the voltage on the word line is activated by, for example, raising the voltage from $V_{SS}$ to $V_{PP}$. As shown in FIG. 1A, the activation of the word line may cause a relatively small voltage variation on the bit line. Then, a bit line sense amplifier may sense this small change in the bit line voltage and amplify it. Thus, the cell data that corresponds to an input column address is amplified to the amplified voltage on the bit line, and this amplified voltage is transmitted to a local data line that corresponds to the column address. Thereafter, the voltage of the word line drops back to $V_{SS}$ (i.e., the word line is turned off). The bit line, however, is maintained at an elevated voltage. Thereafter, in preparation for a subsequent read or write operation, an equalizing operation is performed in which the bit line BL and the complimentary bit line BLB are electrically shorted to precharge the bit line BL and the complimentary bit line BLB to $V_{BL}$.

As shown in FIG. 1A, the time interval from the time at which the word line starts to turn off until the time at which the operation to equalize the bit lines starts is designated as $t_{a1}$. The time at which the word line starts to turn off is referred to herein as the "word line off time" and the time at which the bit line equalization operation starts is referred to herein as the "bit line equalization start time." As is also shown in FIG. 1A, the time interval between the bit line equalization start time through the termination of the bit line precharge operation is designated as $t_{b1}$. The time interval between the end of the precharge operation through the time at which the word line might be reactivated in the next subsequent read or write operation is designated as $t_{c1}$. The time interval $t_{c1}$ represents the timing margin between the termination of the precharge operation and the start of the next read or write operation. Finally, as is also shown in FIG. 1A, the time interval between the activation of the word line and the activation of the next word line in the case of a column cycle of 1 is designated as tRCmin.

FIG. 1B is a timing diagram illustrating the timing of a conventional cell data read operation in a case where the number of column cycles is 2. As shown in FIG. 1B, the process of sensing and amplifying data on the bit line in response to activation of the word line may follow the same process described above with respect to FIG. 1A, and hence this part of the process will not be re-described here. However, as the number of column cycles is 2, the access to the cell data is performed twice. Accordingly, in the example of FIG. 1B, the time interval between activation of the word line and activation of the next word line is tRCmin+2tCK.

In the example of FIG. 1B, the bit line sense amplifier operates for two access operations of the column address since the number of column cycles is 2. In this case (and in the case where the number of column cycles exceeds 2), the voltage of the bit line may be saturated to $V_{DD}$ or $V_{SS}$. As shown in FIG. 1B, the time $t_{a2}$ may be the same as time $t_{a1}$ of FIG. 1A. However, as the bit line BL and the complimentary bit line BLB are equalized from a saturated state, the time interval $t_{b2}$ may be increased as compared to $t_{b1}$ of FIG. 1A.

Therefore, the timing margin $t_{c2}$ of FIG. 1B may be decreased compared with the timing margin $t_{c1}$ of FIG. 1A, thereby deteriorating operation characteristics in the high speed memory devices.

SUMMARY OF THE INVENTION

Pursuant to embodiments of the present invention, methods for controlling the timing of a pre-charge operation in a memory device are provided. In embodiments of the present invention, the timing may be controlled by selecting a word line off time. The word line off time may then be dynamically adjusted based on information about a number of column cycles. The methods may further include selecting a bit line equalization start time. The bit line equalization start time may likewise by dynamically adjusted based on the information about the number of column cycles.

In certain embodiments of the present invention, the information about the number of column cycles may be the burst length. The word line off time may be dynamically selected by, for example, routing a word line disable signal via one of a first plurality of delay paths. Likewise, the bit line equalization start time may be dynamically selected by routing a bit line equalization start signal via one of a second plurality of delay paths. Each of these delay paths may be associated with a respective number of column cycles. The delay paths that are associated with relatively large numbers of column cycles may be shorter than the delay paths that are associated with relatively small numbers of column cycles.

Pursuant to further embodiments of the present invention, methods for controlling a timing of a pre-charge operation are provided in which a word line is turned off using information about a number of column cycles. This may be accomplished, for example, by routing a word line off signal through one of a plurality of first delay paths. A bit line equalization start time may also determined using the information about the number of column cycles. This may be accomplished, for example, by routing a bit line equalization start signal through one of a plurality of second delay paths. The information about the number of column cycles may comprise a burst length. Both the plurality of first delay paths and the plurality of second delay paths may correspond to respective numbers of column cycles.

Pursuant to still further embodiments of the present invention, methods for controlling the pre-charge timing are provided in which the number of column cycles is input. The word line activation time may then be counted using a counting clock, and the word line may be turned off when the counting clock reaches a count corresponding to the input number of column cycles. The methods may also include setting a reference value and/or selecting a bit line equalization start time based on the input number of column cycles. Turning off the word line may comprise comparing the counted word line activation time with the reference value and then turning off the word line when the counted word line activation time is greater than or equal to the reference value.

Pursuant to still further embodiments of the present invention, systems for controlling timing in a memory device are provided which include a control circuit that is configured to select a word line off time from a plurality of word line off times in response to a word line signal and information about a number of column cycles. The control circuit may also be configured to select a bit line equalization start time from a plurality of bit line equalization start times in response to the word line signal and the information about the number of column cycles. The control circuit may comprise a word line off time control circuit and a bit line equalization start time control circuit that are responsive to the word line signal. The word line off control circuit and the bit line equalization start time control circuit may include, respectively, at least one first delay block and at least one second delay block. Each of the blocks may comprise a delay path having one or more delay units. These delay units may comprise inverters.

The word line off time control circuit may also include a first block selection unit and the bit line equalization start time control circuit may include a second block selection circuit. The first and second block selection units may be implemented, for example, as first and second multiplexers.

The system may also include a signal generator that generates a control signal that contains the information about the number of column cycles. The first and second multiplexers may further be responsive to the control signal. In certain embodiments, respective of the delay paths may have predetermined delays that correspond to respective numbers of column cycles. In these embodiments, the word line off time control circuit may select one of the delay paths based on the information about the number of column cycles.

In certain embodiments, the control circuit may further include a counter that is responsive to the word line signal, a decoder that decodes an output of the counter and a multiplexer that selects one of a plurality of outputs of the decoder in response to the information about the number of column cycles. A comparator that is responsive to an output of the multiplexer and to a comparison value may also be provided.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DESCRIPTION OF THE EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
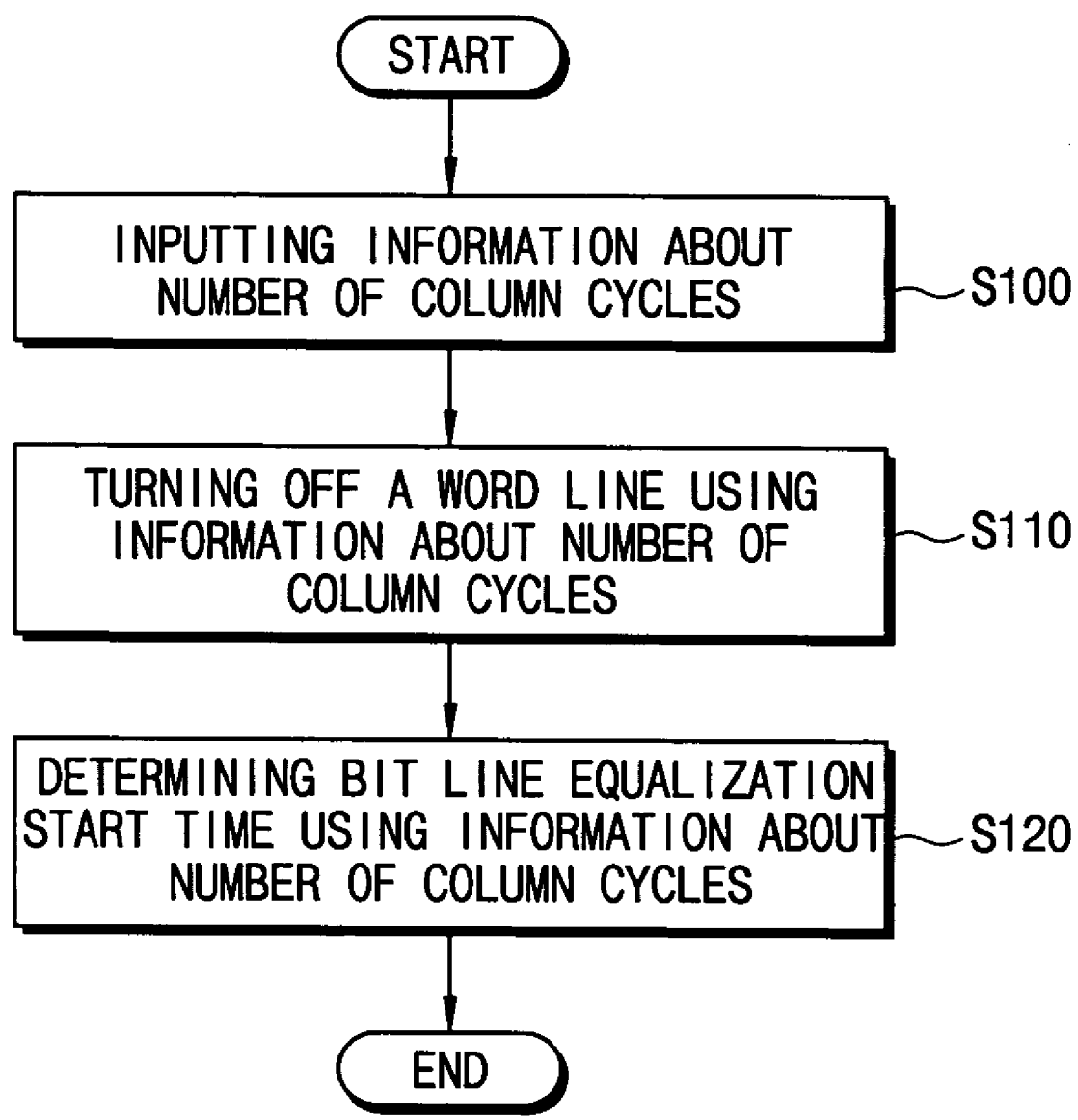
FIG. 2 is a flow chart illustrating methods for controlling the timing of a memory device according to first embodiments of the present invention.

FIG. 2 is a flowchart illustrating methods for controlling the timing of a memory device according to first embodiments of the present invention.

Referring to FIG. 2, in step S100, information about a number of column cycles is received. This information may be used to adjust the word line off time and/or the bit line equalization start time. Specifically, the delay between the issuance of an initial internal command and the time until the word line is turned off may be varied based on the number of column cycles. For example, in a case where the burst length is 4 in a core where a 4-bit prepatch is performed, the desired data can be input and output in one column cycle. If the burst length is increased to 8, the desired data may be input and output in two column cycles. If the number of column cycles is 1, the delay time between the issuance of the initial internal command and the time until the word line is turned off will be a first delay time, and if the number of column cycles is 2, the delay time between the issuance of the initial internal command and the time until the word line is turned off will be a second delay time. The first delay time may be set to be longer than the second delay time. As discussed herein, in certain embodiments of the present invention, the delay time may be set by routing a signal through a selected one of a plurality of delay paths. Thus, as the number of column cycles increases, a delay path corresponding to a shorter delay time may be selected.

In step S110, the selected delay time which, as discussed above, is selected based on the number of column cycles, is used to turn off the word line. When the word line is turned off, the gate voltage of the cell transistor drops, for example, from $V_{PP}$ to $V_{SS}$.

As shown in step S120 of FIG. 2, after the word line is turned off, the bit line equalization start time (i.e., the precharge operation start time) may be determined. The bit line equalization start time may also be determined based on the number of column cycles. If the number of column cycles is large, the time until a bit line precharge signal is generated after the generation of the internal precharge command may be short as compared with the case where the number of column cycles is small.

Figure 3A:
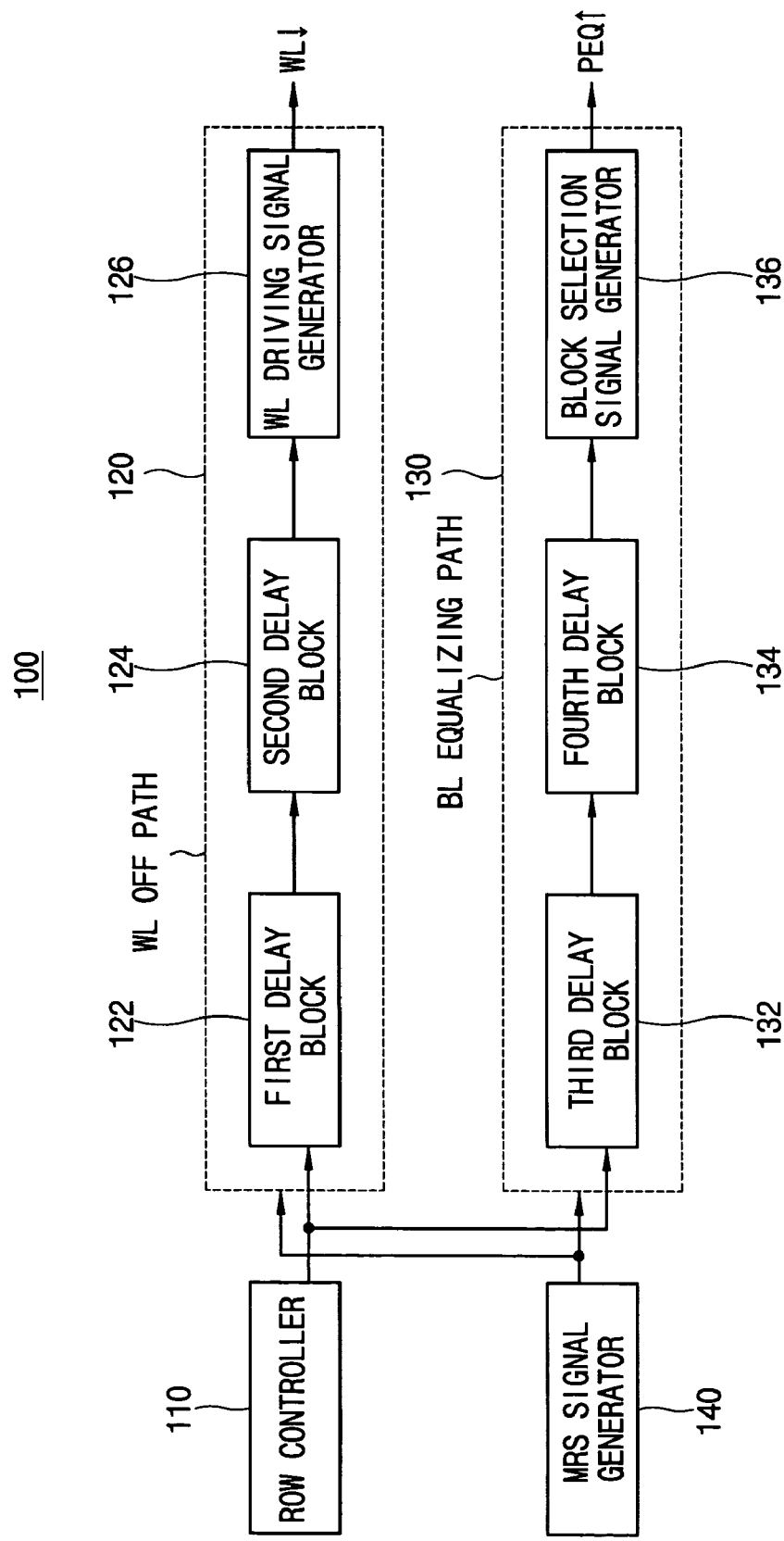
FIGS. 3A and 3B are block diagrams illustrating a timing control circuit of a memory device according to the first embodiments of the present invention.
Figure 3B:
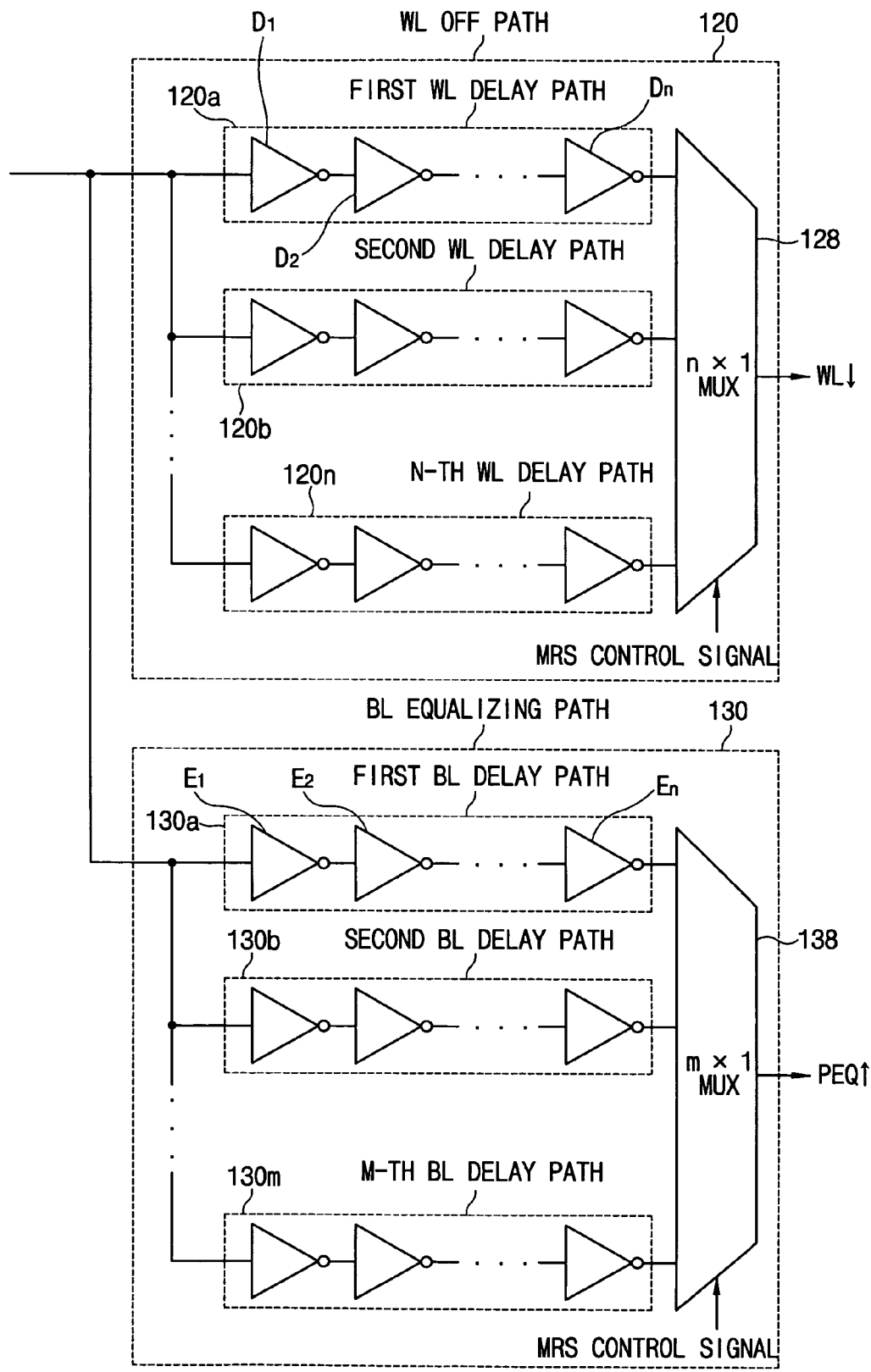

FIGS. 3A and 3B are block diagrams of a timing control circuit 100 of a memory device according to a first embodiment of the present invention. As shown in FIG. 3A, the timing control circuit 100 includes a row controller 110. The row controller 110 may receive internal commands and control the word line in response to such commands. The circuit 100 further includes a word line off path 120 that receives an output signal of the row controller 110 and turns off the word line. The circuit 100 also may include a bit line equalizing path 130 that is configured to receive the output of the row controller 110 and equalize the bit line in response thereto. Finally, the circuit 100 may include a mode register set (MRS) signal generator 140 that may be configured to control an internal delay path based on the number of column cycles.

As shown in FIG. 3A, the word line off path 120 may include a first delay block 122, a second delay block 124, and a word line driving signal generator 126 that generates the word line signal WL. Three or more delay blocks may be provided depending on the memory device. Alternatively, only a single delay block may be provided.

The MRS signal generator 140 may be configured to receive an internal address signal or other signal that includes information about the number of column cycles. The MRS signal generator 140 may be used to generate an MRS control signal that selects one of the delay paths on the word line off path 120 based on the number of column cycles. As a result, the delay time for turning off the word line may be varied based on the number of column cycles.

As is also shown in FIG. 3A, the bit line equalizing path 130 may include a third delay block 132, a fourth delay block 134, and a block selection signal generator 136. The block selection signal generator 136 may be used to generate a bit line equalizing signal PEQ. Three or more delay blocks may be provided depending on the memory device. Alternatively, only a single delay block may be provided in the bit line equalizing path 130.

The MRS signal generator 140 may also be used to generate an MRS control signal that selects one of the delay paths on the bit line equalizing path 130 based on the number of column cycles.

FIG. 3B is a block diagram illustrating an implementation of a word line off path 120 and a bit line equalizing path 130 according to certain embodiments of the present invention.

As shown in FIG. 3B, the word line off path may include a plurality of word line delay paths 120a, 120b, . . . 120n and the bit line equalizing path 130 may include a plurality of bit line delay paths 130a, 130b, . . . 130m. Each of the word line delay paths 120a, 120b, . . . 120n may include a plurality of delay units D1, D2, . . . Dn. The number of delay units in the different word line delay paths 120a, 120b, . . . 120n may vary. Though the delay units D1, D2, . . . Dn are implemented as inverters in the embodiment of the invention depicted in FIG. 3B, it will be appreciated by those of skill in the art that the delay units D1, D2, . . . Dn may be implemented in a wide variety of different ways. Each of the word line delay paths 120a, 120b, . . . 120n may be configured to have a delay time that corresponds to the number of column cycles. For example, the first word line delay path 120a may be configured to have a delay time corresponding to one column cycle, and the second word line delay path 120b may be configured to have a delay time corresponding to two column cycles, and the n-th word line delay path 120n may be configured to have a delay time corresponding to n column cycles.

As is also shown in FIG. 3B, the output signals of the word line delay paths 120a, 120b, . . . and 120n may be input to, for example, an n×1 multiplexer 128. The n×1 multiplexer 128 may be used to select and output the signal on one of the n word line delay paths based on, for example, an MRS control signal that has information about the number of column cycles. Thus, if the number of column cycles is large, the word line off path 120 may select a word line delay path having a short delay time among the word line delay paths 120a, 120b, . . . 120n. If, instead, the number of column cycles is small, a word line delay path having a relatively long delay time may be selected among the word line delay paths 120a, 120b, . . . 120n.

As is further shown in FIG. 3B, the bit line delay paths 130a, 130b, . . . 130m may each include a plurality of delay units E1, E2, . . . En. Although these delay paths are implemented with inverters in the embodiment depicted in FIG. 3B, those of skill in the art will appreciate that numerous other implementations are possible. Each of the bit line delay paths 130a, 130b, . . . 130m may be configured to have a delay time that corresponds to a particular number of column cycles. By way of example, the first bit line delay path 130a may be configured to have a delay time corresponding to one column cycle, the second bit line delay path 130*b* may be configured to have a delay time corresponding to two column cycles, and the mth bit line delay path 130*m* may be configured to have a delay time corresponding to m column cycles.

The output signals of the bit line delay paths 130*a*, 130*b*, . . . 130*m* may be input to an m×1 multiplexer 138. The m×1 multiplexer 138 may be used to select and output one of the bit line delay paths 130*a*, 130*b*, . . . 130*m* based on, for example, an MRS control signal that has information about the number of column cycles. If the number of column cycles is large, a bit line delay path having a short delay time may be selected. If the number of column cycles is small, a bit line delay path having a relatively long delay time may be selected.

Although in FIG. 3A a plurality of parallel delay blocks are used, it will be understood that different configurations are possible, such as, for example, a serial string of delay units with intermediate points in the serial string comprising the inputs to a multiplexer.

Figure 4:
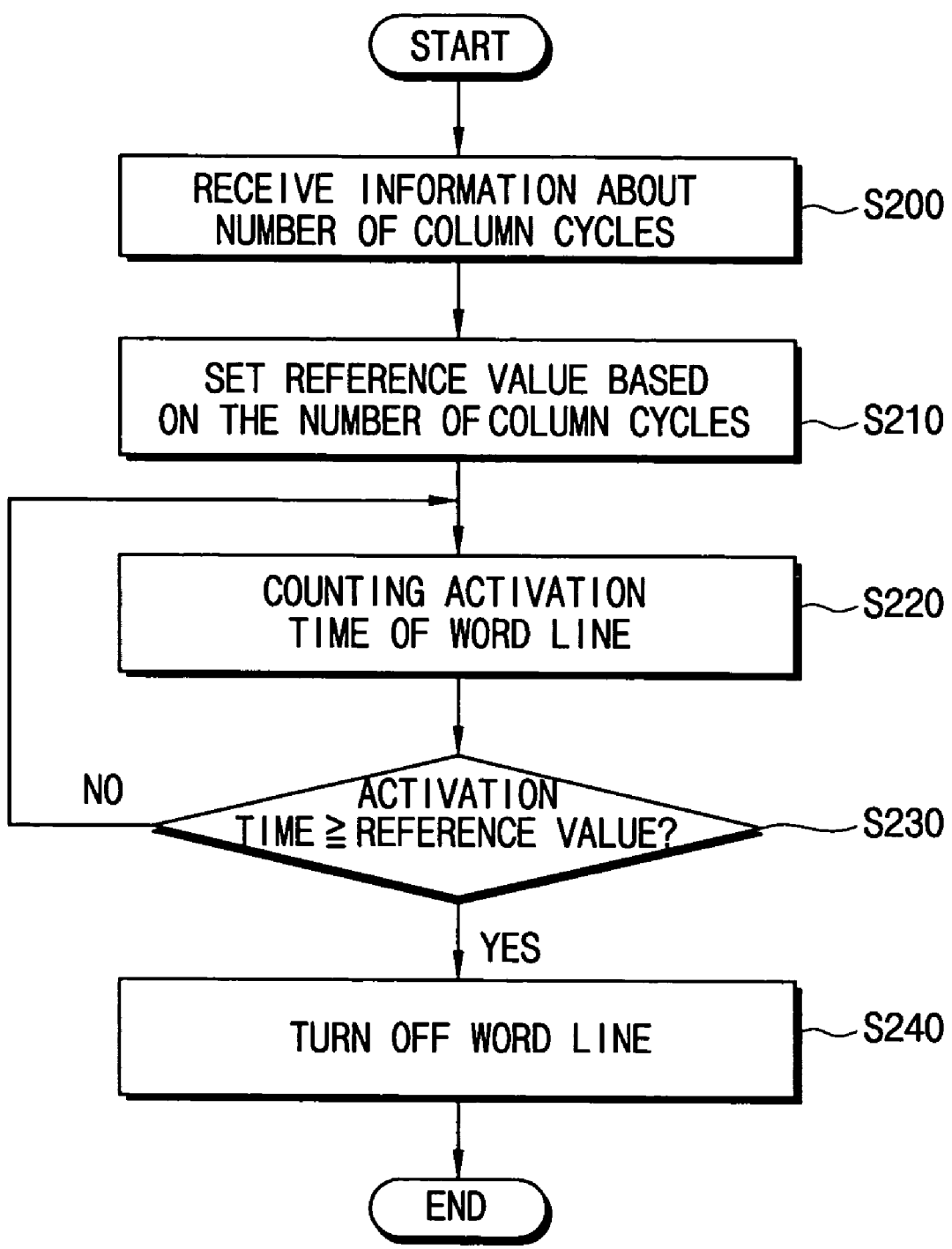
FIG. 4 is a flow chart illustrating methods for controlling the timing of a memory device according to second embodiments of the present invention.

FIG. 4 is a flow chart illustrating methods for controlling the timing of a memory device according to second embodiments of the present invention. As shown in FIG. 4, in step S200, information may be received regarding the number of column cycles. This information may subsequently be used in controlling the activation time of, for example, a word line based on the number of column cycles.

In step S210, a reference value with respect to the activation time of the word line may be set based, for example, on the number of column cycles. After the reference value is set, in step S220 the activation time of the word line may be counted. The counting operation may be carried out, for example, by a counter.

In step S230, the activation time as counted by the counter is compared with the reference value. If the counted activation time is less than the reference value, operations return to step S220. If the counted activation time is more than the reference value, the word line is turned off (block S240).

As noted above, the reference value may be based on the number of column cycles. For example, if the number of column cycles is 1, the reference value may have a first value, whereas if the number of column cycles is 2, the reference value may have a second value that is greater than the first value. Thus, the word line activation time period may be determined based on the reference value.

Figure 5A:
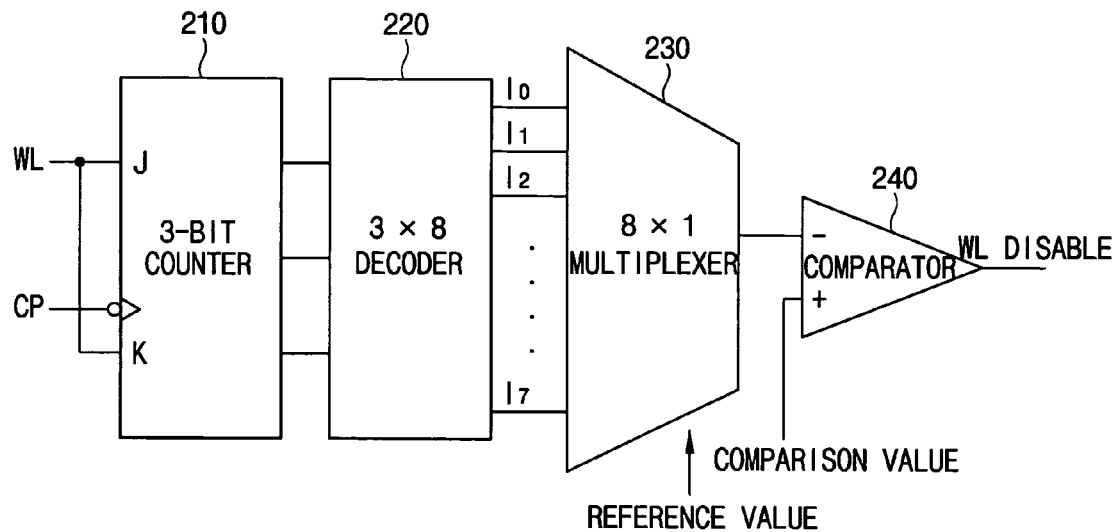
FIGS. 5A and 5B are a circuit diagram of a timing control circuit of a memory device according to the second embodiments of the present invention and an associated timing diagram, respectively.
Figure 5B:
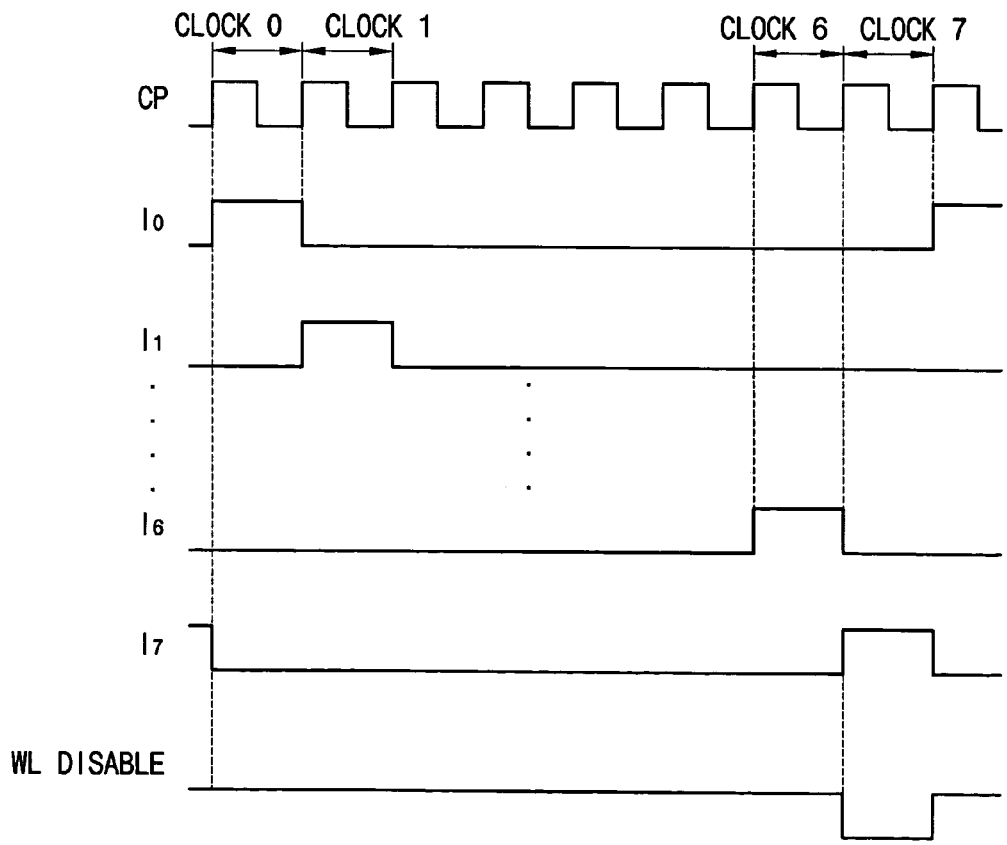

FIGS. 5A and 5B are, respectively, a circuit diagram and a timing diagram that illustrate a method for controlling the timing of a memory device according to the second embodiments of the present invention.

As shown in FIG. 5A, a timing control circuit according to the second embodiments of the present invention may include a 3-bit counter 210 that is responsive to a word line signal WL and a clock pulse, a 3×8 decoder 220 that may be used to decode the output of the 3-bit counter, an 8×1 multiplexer 230 which may be used to select one of the output lines of the decoder 220 in response to a reference value, and a comparator 240 which may be used to compare an output signal of the multiplexer 230 with a comparison value.

Those of skill in the art will appreciate that the circuit of FIG. 5A illustrates a certain embodiment, and that numerous other embodiments may alternatively be used. For example, a counter that covers more than 8 states such as a 4-bit counter may be used in order to more precisely measure the word line activation time period. Likewise, the decoder 220 may include different numbers of input/output terminals. For example, if a 4-bit counter is used, since the number of the output terminals is 4, a 4×16 decoder may be used. Numerous alternative implementations could also be used.

In operation, the multiplexer 230 may be used to select one of the output lines of the decoder 220. Selection of the output line of the decoder 220 is based on the reference value. The reference value may be provided, for example, by the MRS control signal as described above in the embodiment of FIGS. 3A and 3B. Alternatively, the reference value may be a signal that is supplied from another source, including sources external to the memory device.

The output from the multiplexer 230 may be provided to one of the terminals of the comparator 240. A comparison value that is compared to the output of the multiplexer 230 is provided to the other terminal of the comparator 240. The comparator 240 may be used to disable the word line by dropping the gate voltage of the cell transistor from $V_{PP}$ to $V_{SS}$ in response to the output of the multiplexer reaching the comparison value. It will also be appreciated that the comparator 240 is optional.

FIG. 5B is a timing diagram illustrating the operation of the circuit shown in FIG. 5A. Referring to FIG. 5B, the counter 210 may be used to count the number of clock pulses that occur while the word line is activated. If a 3-bit counter such as counter 210 is used, the counter period for the number of pulses may correspond to 8 pulses. The decoder 220 decodes the output signal of the counter 210, and generates a predetermined output signal through an output line. For example, at pulse clock 0, an output line $I_0$ of the decoder 220 is set to a high level. At pulse clock 1, an output line $I_1$ of the decoder 220 is set to a high level. In the same manner, at pulse clock 6, an output line $I_6$ of the decoder 220 is set to a high level, and at pulse clock 7, an output line $I_7$ of the decoder 220 is set to a high level. Although the multiplexer 230 selects the line $I_7$ in the example of FIG. 5B, the multiplexer 230 may select other of the lines according to the reference value input to the multiplexer 230. The reference value may correspond to the number of column cycles. In the example of FIGS. 5A and 5B, when the number of column cycles is small, a predetermined line is selected among $I_0$ through $I_3$, and when the number of column cycles is larger, a predetermined line is selected among $I_4$ through $I_7$. Each line may correspond to a number of column cycles. Only a specific line is selected by the multiplexer 230 among the output lines of the decoder 220. This selected line is provided to one terminal of the comparator 240. The comparison value is provided to the other terminal of the comparator 240. When the level of the selected output line of the decoder 220 is higher than the comparison value, the word line is set to a low level, so that the cell transistor is turned off and maintained in the storage state.

Therefore, the time at which the word line off time starts may be controlled based on the number of column cycles.

Figure 6:
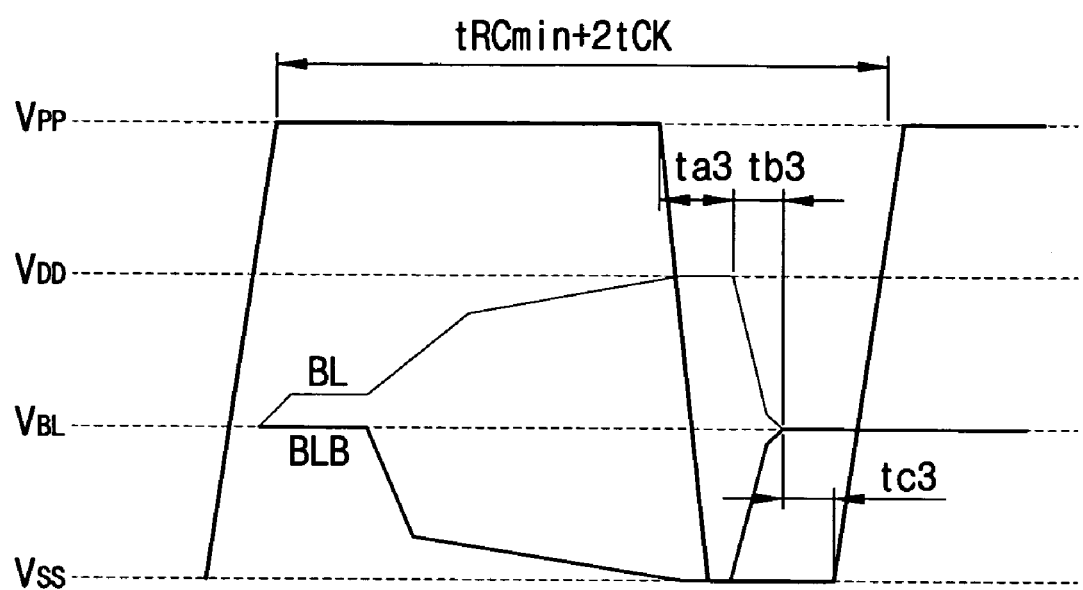
FIG. 6 is a timing diagram illustrating a cell data read operation according to embodiments of the present invention.

FIG. 6 is a timing diagram illustrating a cell data read operation according to certain embodiments of the present invention.

Figure 1A:
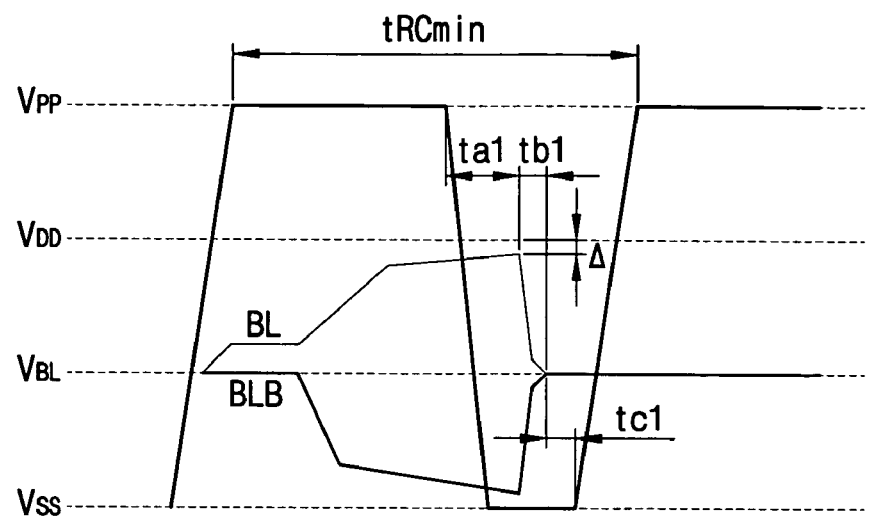
FIGS. 1A and 1B are timing diagrams illustrating conventional cell data read operations.
Figure 1B:
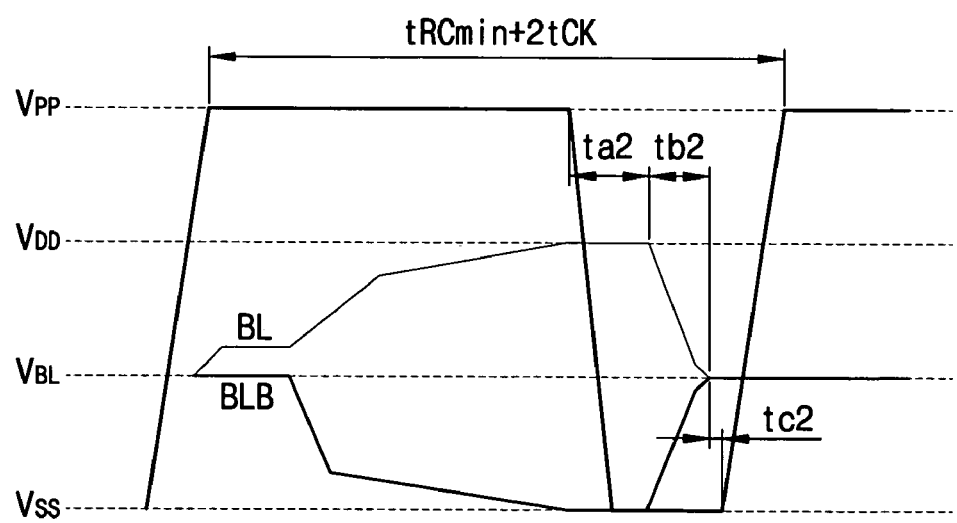

As shown in FIG. 6, when the number of column cycles is 2, the word line off time (i.e., the start of interval $t_{a3}$) occurs earlier in the cycle than does the corresponding word line off time in FIG. 1B (i.e., the start of interval $t_{a2}$). Additionally, the time interval $t_{a3}$ may become shorter than the corresponding periods $t_{a1}$ and $t_{a2}$, in FIGS. 1A and 1B, respectively. As a result, even when the bit line equalization start time (i.e., the start of time period $t_{b3}$) occurs with the bit line in the saturated state $V_{DD}$ or $V_{SS}$, the timing margin $t_{c3}$ may be comparable to the timing margin $t_{c1}$ of FIG. 1A.

It will also be appreciated by those of skill in the art that numerous modifications to the pictured embodiments may be made without departing from the scope of the present invention. By way of example, a circuit similar to the circuit of FIG. 5A may be provided that generates the signal PEQ that is generated in the first embodiment by the bit line equalizing path 130. As another example, it will be understood that the concepts of the first and second embodiments may be combined (e.g., the word line off path 120 of the first embodiment could be implemented using the circuit of FIG. 5A of the second embodiment).

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method for controlling a timing of a pre-charge operation, the method comprising:
    selecting a word line off time; and
    dynamically adjusting the word line off time based on information about a number of column cycles,
    wherein dynamically adjusting the word line off time comprises routing a word line disable signal via one of a first plurality of delay paths, each of the delay paths of the first plurality of delay paths being associated with a respective number of column cycles.

2. The method of claim 1, further comprising:
    selecting a bit line equalization start time;
    dynamically adjusting the bit line equalization start time based on the information about the number of column cycles.

3. The method of claim 2, wherein the information about the number of column cycles comprises a burst length.

4. The method of claim 1, wherein a first subset of the first plurality of delay paths is associated with a first number of column cycles and a second subset of the first plurality of delay paths is associated with a second number of column cycles that is greater than the first number of column cycles;
    wherein a delay path in the first subset of the first plurality of delay paths has a first length and a delay path in the second subset of the first plurality of delay paths has a second length that is shorter than the first length.

5. The method of claim 2, wherein dynamically selecting the bit line equalization start time comprises routing a bit line equalization start signal via one of a second plurality of delay paths.

6. The method of claim 5, wherein each of the delay paths of the second plurality of delay paths is associated with a respective number of column cycles.

7. The method of claim 6, wherein a first subset of the second plurality of delay paths is associated with a first number of column cycles and a second subset of the second plurality of delay paths is associated with a second number of column cycles that is greater than the first number of column cycles;
    wherein a delay path in the first subset of the second plurality of delay paths has a first length and a delay path in the second subset of the second plurality of delay paths has a second length that is shorter than the first length.

8. A method for controlling a precharge timing, comprising:
    inputting a number of column cycles;
    counting a word line activation time using a counting clock;
    turning off the word line when the counting clock reaches a count corresponding to the input number of column cycles; and
    setting a reference value based on the input number of column cycles,
    wherein turning off the word line comprises:
    comparing the counted word line activation time with the reference value; and
    turning off the word line when the counted word line activation time is greater than or equal to the reference value.

9. The method of claim 8, further comprising selecting a bit line equalization start time based on the input number of column cycles.

10. A system for controlling timing in a memory device, comprising:
    a row controller; and
    a control circuit responsive to the row controller, wherein the control circuit is configured to select a word line off time from a plurality of word line off times in response to a word line signal and information about a number of column cycles and further configured to select a bit line equalization start time from a plurality of bit line equalization start times in response to the word line signal and the information about the number of column cycles.

11. The system of claim 10, wherein the control circuit comprises:
    a word line off time control circuit that is responsive to the word line signal, the word line off time control circuit including at least one first delay block; and
    a bit line equalization start time control circuit that is responsive to the word line signal, the bit line equalization start time control circuit including at least one second delay block.

12. The system of claim 11, wherein the word line off time control circuit further includes a first block selection unit, and wherein the bit line equalization start time control circuit further includes a second block selection circuit.

13. The system of claim 12, wherein each of the at least one first delay blocks comprises a first delay path having one or more first delay units, and wherein each of the at least one second delay blocks comprises a second delay path having one or more second delay units.

14. The system of claim 13, wherein the first block selection unit comprises a first multiplexer and wherein the second block selection unit comprises a second multiplexer.

15. The system of claim 13, wherein the first and second delay units comprise inverters.

16. The system of claim 14, further comprising a signal generator that generates a control signal that contains the information about the number of column cycles.

17. The system of claim 16, wherein the first multiplexer and the second multiplexer are further responsive to the control signal.

18. The system of claim 13, wherein respective of the first delay paths have predetermined delays that correspond to respective numbers of column cycles, and wherein the word line off time control circuit selects one of the first delay paths based on the information about the number of column cycles.

19. The system of claim 18, wherein the delay imposed by each of the first delay paths is set based at least in part on the number of column cycles associated with the delay path, with the delay imposed being shorter the larger the number of column cycles.

20. The system of claim 11, wherein the word line signal is provided by the row controller.

21. The system of claim 10, wherein the control circuit comprises:
   a counter that is responsive to the word line signal;
   a decoder that decodes an output of the counter; and
   a multiplexer that selects one of a plurality of outputs of the decoder in response to the information about the number of column cycles.

22. The system of claim 21, further comprising a comparator that is responsive to an output of the multiplexer and to a comparison value.

23. The system of claim 21, wherein the counter is further responsive to a clock pulse signal.

24. The system of claim 21, further comprising a signal generator that generates a control signal that is provided to the multiplexer that contains the information about the number of column cycles.

25. The system of claim 10, wherein the information about the number of column cycles comprises a burst length.

26. A method of operating an integrated circuit memory device including a word line and a bit line coupled to a memory cell, the method including:
   during a first read operation for the memory cell, turning the word line on and then turning the word line off after a first delay;
   during a second read operation for the memory cell, turning the word line on and then turning the word line off after a second delay wherein the first and second delays are different; and
   wherein the first and second delays are selected based on information about a number of column cycles.

27. The method according to claim 26, further comprising:
   providing a clock signal, wherein a difference between the first and second delays is at least one period of the clock signal.

28. The method of claim 2, wherein the method controls the timing of the pre-charge operation of an integrated circuit memory device.

29. The method of claim 28, wherein the integrated circuit memory device is a dynamic random access memory device.

* * * * *